US009048362B2

(12) United States Patent
Kimura et al.

(10) Patent No.: US 9,048,362 B2
(45) Date of Patent: Jun. 2, 2015

(54) SEMICONDUCTOR LIGHT EMITTING DEVICE

(75) Inventors: Shigeya Kimura, Kanagawa-ken (JP); Yoshiyuki Harada, Tokyo (JP); Hajime Nago, Kanagawa-ken (JP); Koichi Tachibana, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 424 days.

(21) Appl. No.: 13/405,565

(22) Filed: Feb. 27, 2012

(65) Prior Publication Data

US 2013/0087761 A1      Apr. 11, 2013

(30) Foreign Application Priority Data

Oct. 11, 2011   (JP) ................................. 2011-224365

(51) Int. Cl.
| | |
|---|---|
| *H01L 33/00* | (2010.01) |
| *H01L 33/06* | (2010.01) |
| *H01L 33/32* | (2010.01) |
| *B82Y 20/00* | (2011.01) |
| *H01S 5/343* | (2006.01) |
| *H01S 5/34* | (2006.01) |

(52) U.S. Cl.
CPC ............. *H01L 33/06* (2013.01); *H01L 33/32* (2013.01); *H01S 5/34333* (2013.01); *H01S 5/3408* (2013.01); *B82Y 20/00* (2013.01)

(58) Field of Classification Search
CPC .......... H01L 33/04; H01L 33/06; H01L 33/31
USPC ..................................... 257/12–15, 79–103
See application file for complete search history.

(56) References Cited

U.S. PATENT DOCUMENTS

| | | | | |
|---|---|---|---|---|
| 5,684,309 | A * | 11/1997 | McIntosh et al. | 257/191 |
| 6,359,919 | B1 * | 3/2002 | Ishikawa et al. | 372/45.01 |
| 6,400,742 | B1 * | 6/2002 | Hatakoshi et al. | 372/46.01 |

(Continued)

FOREIGN PATENT DOCUMENTS

| | | |
|---|---|---|
| JP | 11-8406 | 1/1999 |
| JP | 2000-174327 | 6/2000 |

(Continued)

OTHER PUBLICATIONS

Office Action issued Jul. 27, 2012 in Japanese Patent Application No. 2011-224365 with English language translation.

(Continued)

*Primary Examiner* — Matthew W Such
*Assistant Examiner* — Stephen C Smith
(74) *Attorney, Agent, or Firm* — Oblon, McClelland, Maier & Neustadt, L.L.P.

(57) ABSTRACT

According to one embodiment, a semiconductor light emitting device includes n-type and p-type semiconductor layers containing a nitride semiconductor and a light emitting layer. The emitting layer includes a barrier layer containing III group elements, and a well layer stacked with the barrier layer and containing III group elements. The barrier layer is divided into a first portion on an n-type semiconductor layer side and a second portion on a p-type semiconductor layer side, an In composition ratio in the III group elements of the second portion is lower than that of the first portion. The well layer is divided into a third portion on an n-type semiconductor layer side and a fourth portion on a p-type semiconductor layer side, an In composition ratio in the III group elements of the fourth portion is higher than that of the third portion.

14 Claims, 10 Drawing Sheets

(56) References Cited

U.S. PATENT DOCUMENTS

| | | | |
|---|---|---|---|
| 6,995,389 B2* | 2/2006 | Kim et al. | 257/13 |
| 7,291,868 B2* | 11/2007 | Ando et al. | 257/103 |
| 7,345,324 B2* | 3/2008 | Bour et al. | 257/101 |
| 8,022,388 B2* | 9/2011 | Brandes | 257/13 |
| 8,476,615 B2* | 7/2013 | Enya et al. | 257/13 |
| 8,610,106 B2* | 12/2013 | Shioda et al. | 257/13 |
| 8,642,995 B2* | 2/2014 | Arena | 257/13 |
| 2008/0273566 A1* | 11/2008 | Nishinaka et al. | 372/45.012 |
| 2008/0283822 A1* | 11/2008 | Yui | 257/13 |
| 2011/0133156 A1* | 6/2011 | Won et al. | 257/13 |

FOREIGN PATENT DOCUMENTS

| | | |
|---|---|---|
| JP | 2003-234545 | 8/2003 |
| JP | 2005-56973 | 3/2005 |
| JP | 2008-235606 | 10/2008 |
| JP | 2008-288397 A | 11/2008 |
| JP | 2009-302429 A | 12/2009 |

OTHER PUBLICATIONS

U.S. Appl. No. 13/803,563, filed Mar. 14, 2013, Kimura, et al.
Japanese Office Action issued Nov. 22, 2012 in Patent Application No. 2011-224365 with English Translation.
E. Fred Schubert, "Light Emission Diode", Jan. 25, 2010, pp. 188-189 and additional page.
Office Action issued Jul. 27, 2012 in Japanese Patent Application No. 2011-224365 with English language translation, citing documents AO and AP therein.
U.S. Appl. No. 13/213,373, filed Aug. 19, 2011, Tomonari Shioda, et al.

\* cited by examiner

US 9,048,362 B2

SEMICONDUCTOR LIGHT EMITTING DEVICE

CROSS-REFERENCE TO RELATED APPLICATIONS

This application is based upon and claims the benefit of priority from the prior Japanese Patent Application No. 2011-224365, filed on Oct. 11, 2011; the entire contents of which are incorporated herein by reference.

FIELD

Embodiments described herein relate generally to a semiconductor light emitting device.

BACKGROUND

Nitride-based III-V group compound semiconductors such as gallium nitride (GaN) are applied to a high-intensity light emitting diode (LED), a laser diode (LD), and the like, by taking advantage of their features of a wide band gap.

Each of these light emitting devices includes: an n-type semiconductor layer; a p-type semiconductor layer; and a light emitting layer provided between them and having a quantum well layer and a barrier layer.

Such semiconductor light emitting devices are being required to realize a high light emission efficiency.

DETAILED DESCRIPTION

Figure 1:
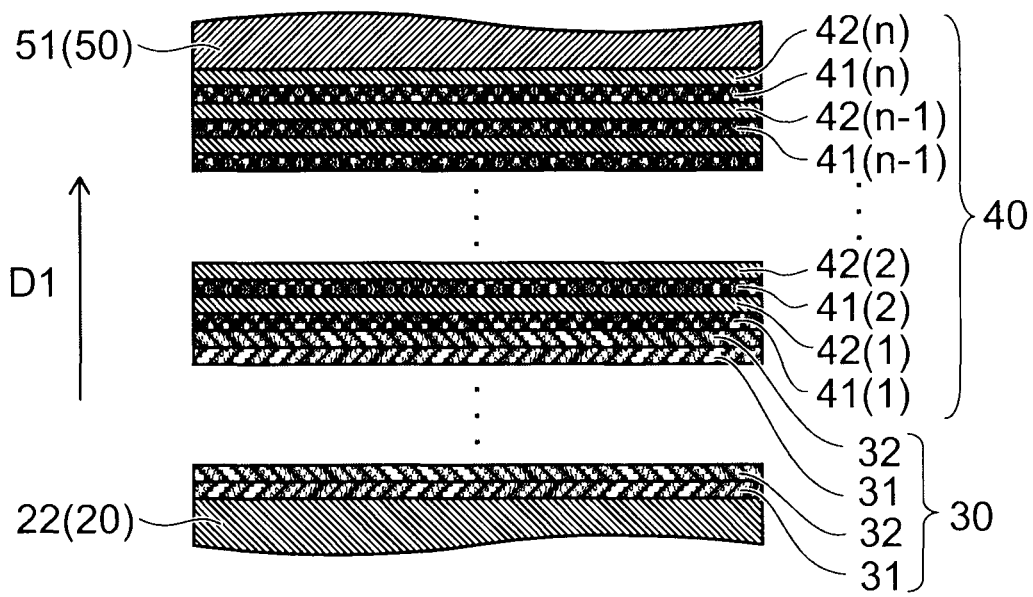
FIG. 1 is a schematic cross-sectional view illustrating the configuration of a part of a semiconductor light emitting device according to an embodiment.

According to one embodiment, a semiconductor light emitting device includes an n-type semiconductor layer containing a nitride semiconductor, a p-type semiconductor layer containing a nitride semiconductor and a light emitting layer provided between the n-type semiconductor layer and the p-type semiconductor layer. The light emitting layer includes a barrier layer containing III group elements, and a well layer stacked with the barrier layer in a direction going from the n-type semiconductor layer toward the p-type semiconductor layer and containing III group elements.

The barrier layer is divided into a first portion on a side of the n-type semiconductor layer and a second portion on a side of the p-type semiconductor layer. When at least the first portion contains In, an In composition ratio in the III group elements of the second portion is lower than an In composition ratio in the III group elements of the first portion.

The well layer is divided into a third portion on a side of the n-type semiconductor layer and a fourth portion on a side of the p-type semiconductor layer. When at least the fourth portion contains In, an In composition ratio in the III group elements of the fourth portion is higher than an In composition ratio in the III group elements of the third portion.

Various embodiments of the invention will be described hereinafter with reference to the accompanying drawings.

The drawings are schematic or conceptual; and the relationships between the thicknesses and widths of portions, the proportions of sizes among portions, etc., are not necessarily the same as the actual values thereof. Further, the dimensions and the proportions may be illustrated differently among the drawings, even for identical portions.

In the specification and the drawings of the application, components similar to those described in regard to a drawing thereinabove are marked with like reference numerals, and a detailed description is omitted as appropriate.

Embodiments

FIG. 1 is a schematic cross-sectional view illustrating a part of a configuration of a semiconductor light emitting device according to an embodiment.

Figure 2:
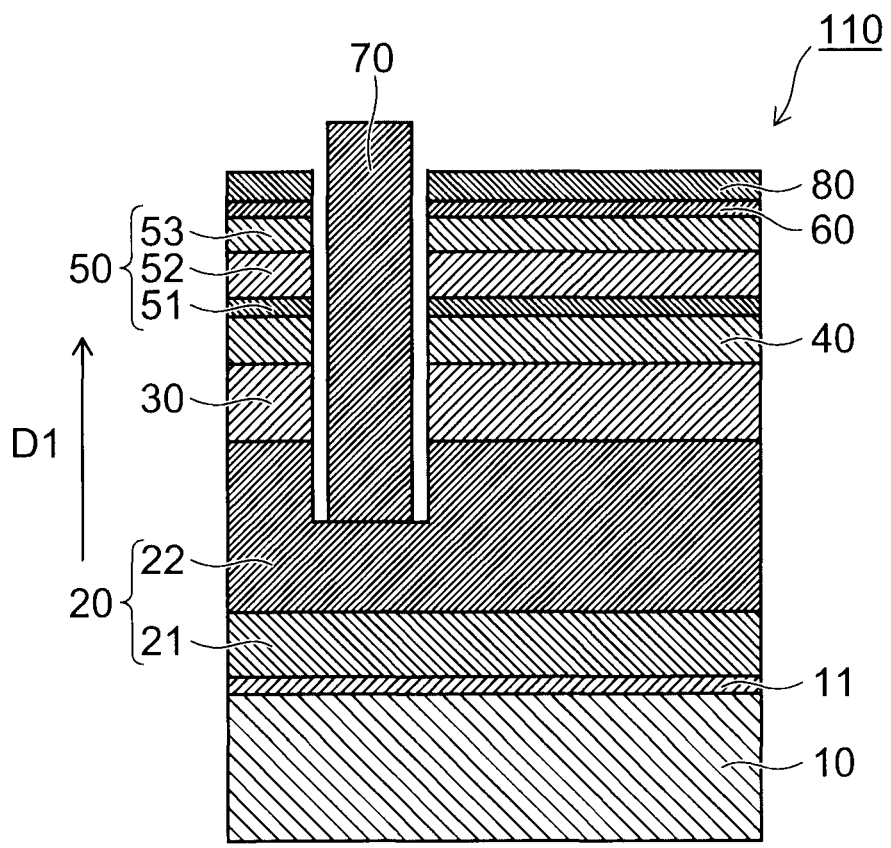
FIG. 2 is a schematic cross-sectional view illustrating the configuration of the semiconductor light emitting device according to the embodiment.

FIG. 2 is a schematic cross-sectional view illustrating the configuration of the semiconductor light emitting device according to the embodiment.

As shown in FIG. 2, the semiconductor light emitting device 110 according to the embodiment includes: an n-type semiconductor layer 20; a p-type semiconductor layer 50; and a light emitting layer 40 provided between the n-type semiconductor layer 20 and the p-type semiconductor layer 50. In the semiconductor light emitting device 110, a stacked body 30 may be provided between the light emitting layer 40 and the n-type semiconductor layer 20.

Each of the n-type semiconductor layer 20 and the p-type semiconductor layer 50 contains a nitride semiconductor.

The light emitting layer 40 is, for example, an active layer. The stacked body 30 is, for example, a super-lattice layer.

In the semiconductor light emitting device 110, the buffer layer 11 is provided on a major surface (for example, c-plane) of a substrate 10 composed of, for example, sapphire, and, for example, an undoped-GaN foundation layer 21 and an n-type GaN contact layer 22 are provided thereon. The n-type GaN contact layer 22 is contained in the n-type semiconductor layer 20. The GaN foundation layer 21 may also be contained in the n-type semiconductor layer 20 for convenience.

A stacked body 30 is provided on the n-type GaN contact layer 22. In the stacked body 30, for example, first crystal layers 31 and second crystal layers 32 are stacked alternatively.

On the stacked body 30, the light emitting layer 40 (active layer) is provided. The light emitting layer 40 has, for example, a multiple quantum well (MQW) structure. That is, the light emitting layer 40 includes the structure in which a plurality of barrier layers 41 and a plurality of well layers 42 are stacked alternatively and repeatedly. The detailed configuration of the barrier layer 41 and the well layer 42 will be described later.

On the light emitting layer 40, a p-type AlGaN layer 51, a Mg doped GaN layer 52, and a p-type GaN contact layer 53, are provided in this order. The p-type AlGaN layer 51 has a function as an electron overflow suppression layer. The p-type AlGaN layer 51, the Mg doped GaN layer 52, and the p-type GaN contact layer 53, are contained in the p-type semiconductor layer 50. Furthermore, a transparent electrode 60 is provided on the p-type GaN contact layer 53.

Then, an n-side electrode 70 is provided on the n-type GaN contact layer 22 by removing a part of the n-type GaN contact layer 22, which is the n-type semiconductor layer 20, and areas of the stacked body 30, the light emitting layer 40, and the p-type semiconductor layer 50, which correspond to the part. A stacked structure of, for example, Ti/Pt/Au is used for the n-side electrode 70, for example. In contrast, a p-side electrode 80 is provided on the transparent electrode 60.

As described above, the semiconductor light emitting device 110 of the specific example according to the embodiment is a light emitting diode (LED).

The semiconductor light emitting device 110 can be manufactured, for example, as follows.

First, the substrate 10 of, for example, a c-plane sapphire subjected to organic cleaning or acid cleaning, is introduced into a reactor of MOCVD (Metal Organic Chemical Vapor Deposition) apparatus, and is heated to about 1100° C. on a susceptor in the reactor. Thereby, the oxide film of the surface of the substrate 10 is removed.

Next, the buffer layer 11 is grown on the major surface (c-plane) of the substrate 10 at a thickness of 30 nm. Furthermore, an undoped GaN foundation layer 21 of is grown on the buffer layer 11 at a thickness of 3 micrometers (μm). Moreover, an n-type GaN contact layer 22 composed of Si doped GaN is grown on the GaN foundation layer 21 at a thickness of 2 μm.

Next, on the n-type GaN contact layer 22, the stacked body 30 is formed by stacking the first crystal layers 31 composed of $In_xGa_{1-x}N$, and second crystal layers 32 composed of $In_yGa_{1-y}N$, alternatively by 30 periods.

Next, the barrier layers 41 and the well layers 42 are alternatively stacked on the stacked body 30.

Furthermore, a 5 nm thick AlGaN layer having Al composition ratio of 0.003 is grown on the top barrier layer 41, and subsequently, a 10 nm thick Mg doped AlGaN layer 51 having Al composition ratio of 0.1, a 80 nm thick Mg doped p-type GaN layer 52 (Mg concentration is $2\times10^{19}/cm^3$), and an about 10 nm thick high concentration Mg doped GaN layer 53 (Mg concentration is $1\times10^{21}/cm^3$), are stacked thereon. Then, the substrate on which the above-mentioned crystals are grown is taken out from the reactor of MOCVD apparatus.

Next, a part the multilayered film structure is exposed by subjecting the n-type GaN contact layer 22 to dry etching to the middle, and the n-side electrode 70 of Ti/Pt/Au is formed thereon. Furthermore, the transparent electrode 60 composed of ITO (Indium Tin Oxide) is formed on the surface of the high concentration Mg doped GaN layer 53, and the p-side electrode 80 composed of Ni/Au with diameter of, for example, 80 μm is formed in a part of the transparent electrode 60. Thereby, the semiconductor light emitting device 110 is fabricated.

Although, the example using MOCVD (metalorganic chemical vapor deposition) method as a film formation method have been described above, another method, such as for example, a molecular beam epitaxial (MBE) method or a halide vapor phase epitaxial (HVPE) method, is also applicable.

Next, the multiple quantum well structure of the light emitting layer 40 will be described.

As shown in FIG. 1, the multi quantum wells structure of the light emitting layer 40 has a plurality of barrier layers 41(1) to 41(n) and a plurality of well layers 42(1) to 42(n). In addition, "n" contained in reference numerals is an integer not less than 2, corresponding to the number of the layer.

In the specification, when the plurality of barrier layers 41(1) to 41(n) and the plurality of well layers 42(1) to 42(n) are referred to without being distinguished, they are referred to as the barrier layers 41 and the well layers 42, respectively.

The plurality of barrier layers 41 have the first barrier layer 41(1), the second barrier layer 41(2), - - - , the (n−1)-th barrier layer 41(n−1), and the n-th barrier layer 41(n) from the n-type semiconductor layer 20 towards the p-type semiconductor layer 50.

The plurality of well layers 42 have the first well layer 42(1), the second well layer 42(2), - - - , the (n−1)-th well layer 42(n−1), and the n-th well layer 42(n) from the n-type semiconductor layer 20 toward the p-type semiconductor layer 50.

Each of the barrier layer 41 and the well layer 42 contains III group elements. Small amounts of Al or the like may be contained therein.

An nitride semiconductor containing, for example, In, is used for the well layer 42. The band gap energy of the barrier layer 41 is larger than the band gap energy of the well layer 42.

For example, the barrier layer 41 contains $In_bGa_{1-b}N$ (b≥0). The thickness of the barrier layer 41 is represented as $t_b$ (nanometers). The thickness $t_b$ of the barrier layer 41 is, for example, not more than 10 nanometers (nm).

The well layer 42 contains $In_wGa_{1-w}N$ (0<w<1). The thickness of the well layer 42 is represented as $t_w$ (nanometers). The thickness $t_w$ of the well layer 42 is, for example, not less than 2.5 nm and not more than 6 nm.

Here, the band gap of the well layer 42 is lower than the band gap of the barrier layer 41. This is equivalent to b<w, for a case of, for example, a system using $In_bGa_{1-b}N$ as the barrier layer 41 and $In_wGa_{1-w}N$ as the well layer 42.

Figure 3A:
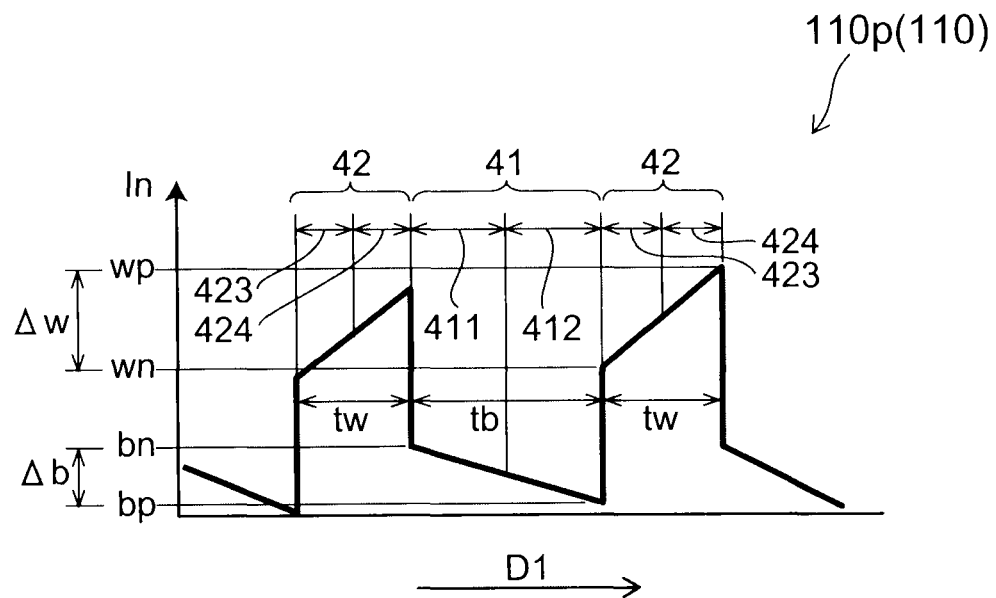
FIGS. 3A and 3B illustrate profiles of In composition ratios of the light emitting layer.
Figure 3B:
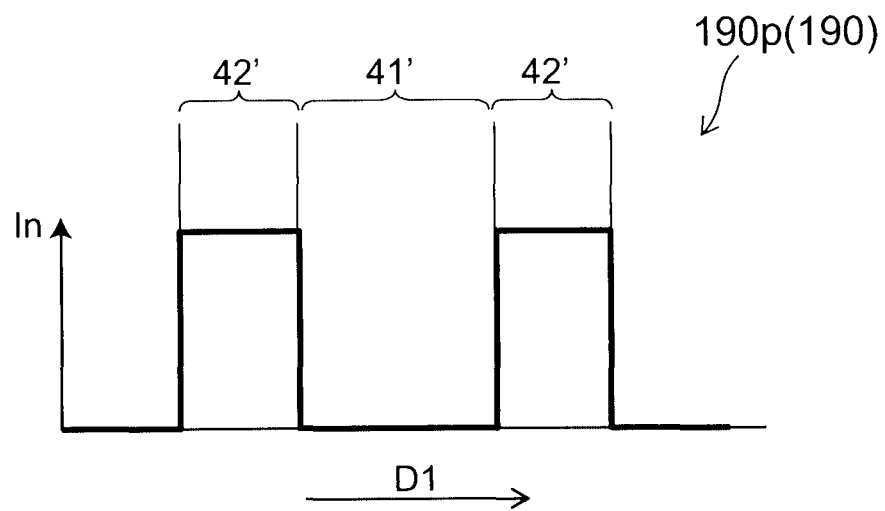

FIGS. 3A and 3B illustrate profiles of In composition ratios of the light emitting layer.

In FIGS. 3A and 3B, the horizontal axis represents the position of the light emitting layer 40 (position in the thickness direction) and the vertical axis represents In composition ratio.

In FIG. 3A, a part of the profile 110P of In composition ratio in the light emitting layer of the semiconductor light emitting device 110 according to the embodiment is shown.

In FIG. 3B, a part of the profile 190P of In composition ratio in a light emitting layer of a semiconductor light emitting device 190 according to a reference example is shown.

In both of the drawings, for the sake of simple explanation, In composition ratios of two well layers 42 and one barrier layer 41 provided between these two well layers 42 are represented.

As represented in FIG. 3A, in the profile 110P of In composition of the semiconductor light emitting device 110 according to the embodiment, In composition ratio in the III group elements of the barrier layer 41 decreases in a direction going from the n-type semiconductor layer 20 toward the p-type semiconductor layer 50 (first direction D1), and In composition ratio in the III group elements of the well layer 42 increases in the first direction D1.

That is, when one barrier layer 41 is divided into a first portion 411 on the side of the n-type semiconductor layer 20 and a second portion 412 on the side of the p-type semiconductor layer 50, In composition ratio averaged by the thickness of the second portion 412 is lower than In composition ratio averaged by the thickness of the first portion 411.

Here, In composition ratio averaged by the thickness of a layer is set to average In composition ratio.

If In composition ratio in the III group elements of the barrier layer 41 decreases toward the first direction D1, the band gap of the barrier layer 41 becomes smaller as the barrier layer 41 is closer to the n-type semiconductor layer 20, and the gap becomes larger as the barrier layer 41 is closer to the p-type semiconductor layer 50. That is, the band gap in one barrier layer 41 becomes larger gradually toward the first direction D1.

In contrast, when one well layer 42 is divided into a third portion 423 on the side of the n-type semiconductor layer 20 and a fourth portion 424 on the side of the p-type semiconductor layer 50, average In composition ratio of the fourth portion 424 is lower than average In composition ratio of the third portion 423.

If In composition ratio in the III group elements of the well layer 42 increases in the first direction D1, the band gap of the well layer 42 becomes larger as the well layer 42 is closer to the n-type semiconductor layer 20, and the gap becomes smaller as the well layer 42 is closer to the p-type semiconductor layer 50. That is, the band gap in one well layer 42 becomes smaller gradually toward the first direction D1.

In order to change the band gap gradually, for a case of, for example, a system using $In_bGa_{1-b}N$ as the barrier layer 41 and $In_wGa_{1-w}N$ as the well layer 42, In composition ratio b of the barrier layer 41 may be gradually made smaller toward the first direction D1 and In composition ratio w of the well layer 42 may be gradually made larger toward the first direction D1.

As described above, the band structure in the light emitting layer 40 is modulated by decreasing In composition ratio in the III group elements of the barrier layer 41 toward the first direction D1 and increasing In composition ratio in the III group elements of the well layer 42 toward the first direction D1 to thereby optimize the band structure when a voltage is applied to the light emitting layer 40. This suppresses decline in the recombination probability of electrons and holes or the efficiency of carrier injection, thereby achieving improvement in light emission efficiency.

In the profile 190P of In composition ratio of the semiconductor light emitting device 190 according to the reference example shown in FIG. 3B, In composition ratios toward the first direction D1 are constant for both of the barrier layer 41' and the well layer 42'.

Here, in a quantum well layer composed of a nitride semiconductor having a wurtzite structure grown in the c-axis direction, the internal electric field generated in the layer degrades the light emission recombination and the efficiency of carrier injection of a light emitting device such as LED. This is due to generation of a piezo-electric field by lattice strain derived from mismatch between the lattice constant of the crystal (for example, InGaN) constituting the well layers 42 and 42', and the lattice constant of the crystal (for example, InGaN with In composition ratio different from In composition ratio of the well layer 42') constituting the barrier layers 41 and 41'. If the band structure of the light emitting layer 40 is modulated by the piezo-electric field, the recombination probability of electrons and holes and the efficiency of carrier injection are degraded.

In the semiconductor light emitting device 190 according to the reference example, the light emission efficiency is degraded due to the modulation of the band structure by the piezo-electric field.

In contrast, in the semiconductor light emitting device 110 according to the embodiment, as shown in FIG. 3A, by changing In composition ratios of the barrier layer 41 and the well layer 42 in the first direction D1, the band structure when an electric field is applied to the light emitting layer 40 is optimized so that the recombination probability of electrons and holes and the efficiency of carrier injection are enhanced.

In addition, in the MQW structure where a plurality of barrier layers 41 and a plurality of well layers 42 are provided, the profile as shown in FIG. 3A, in which In composition ratio of the barrier layer 41 decreases toward the first direction D1, and the In composition ratio of the well layer 42 increases toward the first direction D1, may be applied to all of the plurality of barrier layers 41 and the plurality of well layers 42, or may be applied to a part of the barrier layers 41 and a part of the well layers 42.

Next, a specific example of the barrier layer 41 and the well layer 42 of the semiconductor light emitting device 110 according to the embodiment will be described.

In addition, although the light emitting layer 40 has a plurality of barrier layers 41 and a plurality of well layers 42, for the sake of simple explanation, description will be done for a case in which average In composition ratios in each of the plurality of barrier layers 41 are mutually the same and thicknesses in each of the plurality of barrier layers 41 are also mutually the same. Furthermore, similarly, description will be done for a case in which average In composition ratios in each of the plurality of well layers 42 are mutually the same and thicknesses in each of the plurality of well layers 42 are also mutually the same.

In the semiconductor light emitting device 110 according to the specific example, thickness $t_b$ of the barrier layer 41 is made thin being not more than 10 nm. By this procedure, holes injected from the p-type semiconductor layer 50 are efficiently supplied to the light emitting layer 40, thereby, enhancing the light emission efficiency of the semiconductor light emitting device 110. Furthermore, the operating voltage of the semiconductor light emitting device 110 is reduced to a practically demanded level.

In the semiconductor light emitting device 110 according to the embodiment, it is desirable that the thickness $t_w$ of the well layer 42 is as thick as possible, preferably, not less than 3 nm, more preferably, not less than 4 nm.

In the semiconductor light emitting device 110 according to the embodiment, when In composition ratio at the interface of one barrier layer 41 on the side of the n-type semiconductor layer 20 is defined as bn, and the In composition ratio at the interface of the barrier layer 41 on the side of the p-type semiconductor layer 50 is defined as bp, it is preferable to make bn not less than 0.02, more preferably about 0.04.

In one barrier layer 41, this In composition ratio b is gradually decreased toward the first direction D1. It is desirable to make In composition ratio by at the interface of the barrier layer 41 on the side of the p-type semiconductor layer 50 to 0.00. As In composition ratio by becomes smaller, improvement in light emission efficiency is achieved without degrading the crystallinity of the barrier layer 41. Here, 0.00 of the In composition ratio by includes the case where In is unintentionally contained in a manufacturing process.

Moreover, it is preferable to make the absolute value (Δb) of the difference between In composition ratio bn and In composition ratio bp, for example, larger than 0.02 and smaller than 0.06, more preferably about 0.04.

In the semiconductor light emitting device 110 according to the embodiment, when In composition ratio at the interface of one well layer 42 (for example, the well layer 42 neighboring the barrier layer 41 on the side of the p-type semiconductor layer 50) on the side of the n-type semiconductor layer 20 is defined as wn, and In composition ratio at the interface of the well layer 42 on the side of the p-type semiconductor layer 50 is defined as wp, if the device 110 is LED that emits blue light, it is preferable to make In composition ratio wn not more than 0.10, more preferably about 0.06.

This In composition ratio w is made to increase gradually toward the first direction D1 in one well layer 42. It is preferable to make In composition ratio wp at the interface of the well layer 42 on the side of the p-type semiconductor layer not less than 0.14, more preferably about 0.18. By modulating the composition ratio in such a manner, the light emission efficiency can be improved without degrading the crystallinity of the well layer 42.

Furthermore, it is preferable to make the absolute value (Δw) of the difference between In composition ratio wn and In composition ratio wp, for example, larger than 0.04 and smaller than 0.12, more preferably not less than 0.06, further preferably about 0.10.

The configuration of complementary energy bands produced by gradual changes of the thickness of In composition ratio of the barrier layer 41 and gradual changes of the thickness of In composition ratio of the well layer 42 described above, realizes high light emission efficiency of the semiconductor light emitting device 110.

FIGS. 4A to 4D illustrate energy bands and carrier concentration distributions.

In any of the drawings of FIGS. 4A to 4D, the horizontal axis represents a position (position in the thickness direction). The horizontal axes of FIGS. 4A to 4D show positions of a part including three well layers 42(n), 42(n-1) and 42(n-2) on the side of the p-type semiconductor layer 50 and two barrier layers 41(n) and 41(n-1) among them.

Figure 4A:
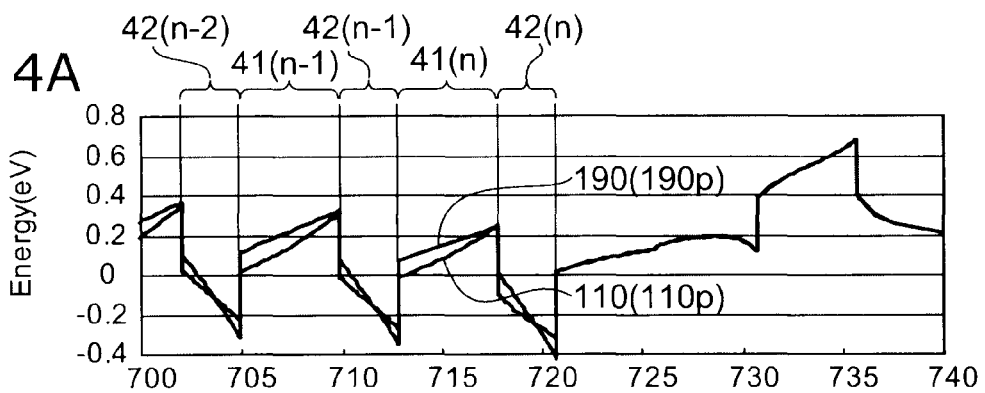
FIGS. 4A to 4D illustrate energy bands and carrier concentration distributions.
Figure 4B:
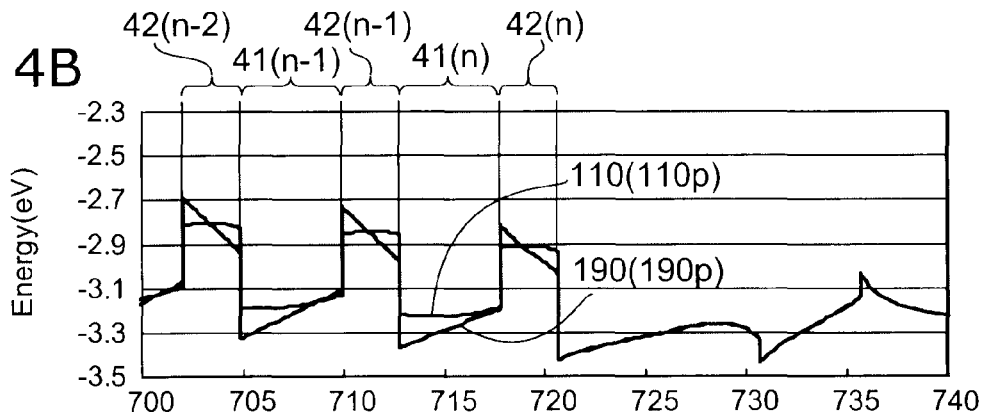
Figure 4C:
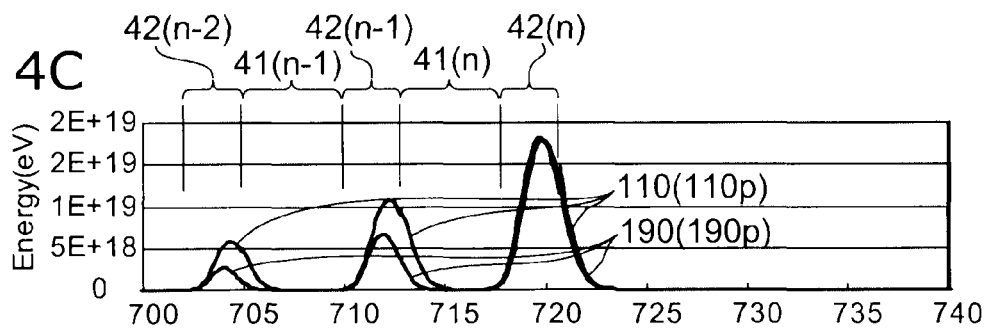
Figure 4D:
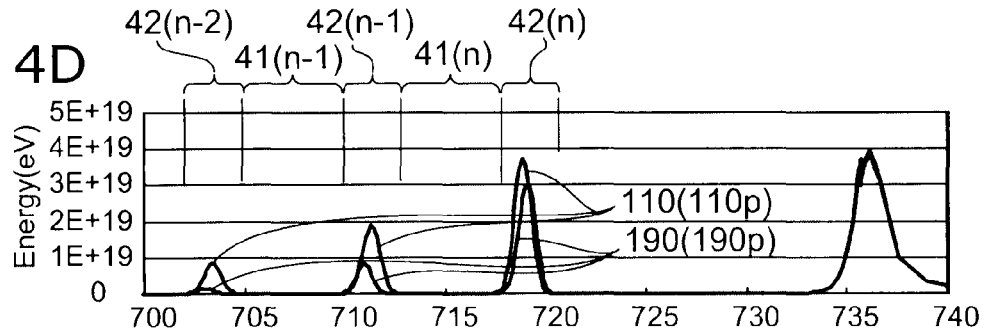

FIG. 4A shows the energy band diagram of a conduction band, FIG. 4B shows the energy band diagram of a valence band, FIG. 4C shows the concentration of electrons, and FIG. 4D shows the concentration of holes.

In FIGS. 4A to 4D, cases of the profile 110P of In composition ratio of the semiconductor light emitting device 110 according to the embodiment represented in FIG. 3A and the profile 190P of In composition ratio of the semiconductor light emitting device 190 according to the reference example represented in FIG. 3B are illustrated, respectively.

In the profile 110P of In composition ratio of the semiconductor light emitting device 110 according to the embodiment, for the well layer 42, In composition ratio wn is 0.10 and In composition ratio wp is 0.18, i.e., Δw=0.08, and in the barrier layer 41, In composition ratio by is 0.00 and In composition ratio bn is 0.04, i.e., Δb=0.04. In addition, the thickness $t_w$ of the well layer 42 is 3 nm and the thickness $t_b$ of the barrier layer 41 is 5 nm.

Furthermore, in the profile 190P of In composition ratio of the semiconductor light emitting device 190 according to the reference example, In composition ratio w of the well layer 42' is 0.13 and In composition ratio b of the barrier layer 41' is 0.00. In addition, the thickness $t_w$ of the well layer 42' is 3 nm and the thickness $t_b$ of the barrier layer 41 is 5 nm.

As shown in FIGS. 4A and 4B, if the profile 110P of In composition according to the embodiment is applied, the energy band diagrams of the conduction band and the valence band change as compared with a case where the profile 190P of In composition according to the reference example is applied.

Especially, significant change appears in the energy band diagram of the valence band represented in FIG. 4B. By applying the profile 110P of In composition according to the embodiment, modulation of the valence band in the light emitting layer 40 due to the internal electric field is suppressed. That is, the energy band diagram of the valence band becomes rectangular by the mutual increase and decrease in In composition ratios of the barrier layer 41 and the well layer 42.

Thereby, as shown in FIG. 4D, localization of holes at the interface between the well layer 42 and the barrier layer 41 is suppressed. Furthermore, spatial dissociation of electrons and holes is suppressed by the well layer 42 and the barrier layer 41. Moreover, the efficiency of hole injection into the well layer 42 on the side of the n-type semiconductor layer 20 is increased. These results extremely enhances the efficiency of light emission of the semiconductor light emitting device 110 according to the embodiment in comparison with the efficiency of light emission of the semiconductor light emitting device 190 according to the reference example.

Hereinafter, results of examination acting as the base for finding out the conditions as mentioned above will be described.

In the examination, a semiconductor light emitting device is configured by changing the configuration of the light emitting layer 40 (the way for modulating the thickness or In composition ratio of the barrier layer 41 and the way for modulating the thickness or In composition ratio of the well layer 42), and the internal quantum efficiencies for the respective cases are compared.

Example

In an semiconductor light emitting device 111 according to the embodiment, the number of the barrier layers 41 and the well layers 42 is eight periods.

In the semiconductor light emitting device 111, In composition ratio bn at the interface of the barrier layer 41 on the side of the n-type semiconductor layer 20 is 0.04, In composition ratio by at the interface of the barrier layer 41 on the side of the p-type semiconductor layer 50 is 0.00, and In composition ratio in the layer changes linearly.

Furthermore, in the semiconductor light emitting device 111, In composition ratio wn at the interface of the well layer 42 on the side of the n-type semiconductor layer 20 is 0.08, In composition ratio wp at the interface of the well layer 42 on the side of the p-type semiconductor layer 50 is 0.18, and In composition ratio in the layer changes linearly.

Moreover, in a semiconductor light emitting device 191 according to the reference example, the number of barrier layers 41' and well layers 42' is eight periods. In the semiconductor light emitting device 191 according to the reference example, In composition ratio b of the barrier layer 41' is constant at 0.00 in the layer (namely, the layer is composed of GaN), and In composition ratio w of the well layer 42' is constant at 0.13 in the layer (namely, the layer is composed of $In_{0.13}Ga_{0.87}N$).

In any of the semiconductor light emitting devices 110 and 190, the thickness $t_b$ of the barrier layer 41 is a constant value of 5 nm, and the thickness $t_w$ of the well layer 42 is a constant value of 3 nm.

Figure 5:
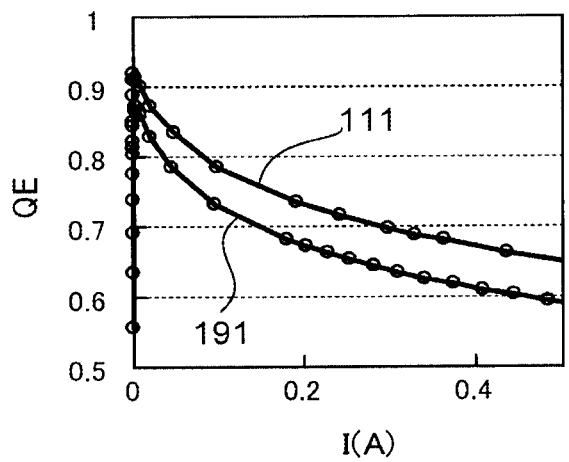
FIG. 5 illustrates examination results regarding the semiconductor light emitting devices.

FIG. 5 illustrates examination results regarding the semiconductor light emitting devices.

In FIG. 5, the horizontal axis represents current I (ampere: A), and the vertical axis shows the internal quantum efficiency QE.

In FIG. 5, the internal quantum efficiency of the semiconductor light emitting device 111 according to the embodiment and the internal quantum efficiency of the semiconductor light emitting device 191 according to the reference example are represented.

In addition, in FIG. 5, the internal quantum efficiency is represented by relative values using the peak top value of the internal quantum efficiency of the semiconductor light emitting device 191 according to the reference example as 1.

As shown in FIG. 5, it is understood that the internal quantum efficiency of the semiconductor light emitting device 111 according to the embodiment is clearly improved than the internal quantum efficiency of the semiconductor light emitting device 191 according to the reference example.

Figure 6A:
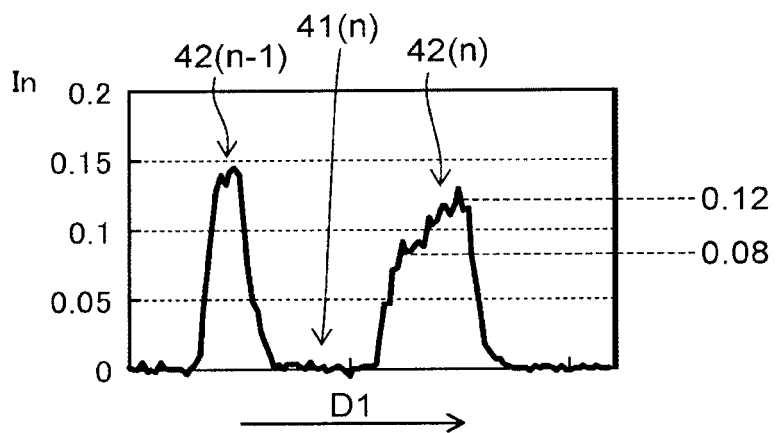
FIGS. 6A and 6B show In composition ratios.
Figure 6B:
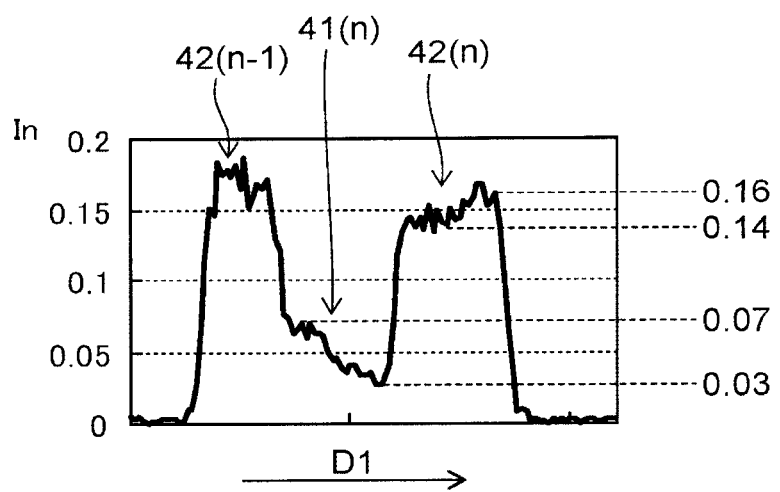

FIGS. 6A and 6B show one example of analysis results of In composition ratio using a three-dimensional atom probe, respectively.

In FIGS. 6A and 6B, the horizontal axis represents a position, and the vertical axis represents In composition ratio.

In FIGS. 6A and 6B, In composition ratios of the n-th well layer 42(n), the n-th barrier layer 41(n), and the (n−1)-th well layer 42(n−1) are shown, respectively.

In FIG. 6A, an example in which In composition ratio w of the well layer 42 ($In_wGa_{1-w}N$) is made to increase toward the first direction D1, is shown. In this example, In composition ratio w of the n-th well layer 42(n) is increased from 0.08 to 0.12 toward the first direction D1.

In FIG. 6B, an example in which In composition ratio b of the barrier layer 41 ($In_bGa_{1-b}N$) is made to decrease toward the first direction D1 and In composition ratio w of the well layer 42 ($In_wGa_{1-w}N$) is made to increase toward the first direction D1, is shown. In this example, In composition ratio b of the n-th barrier layer 42(n) is decreased from 0.07 to 0.03 toward the first direction D1 and In composition ratio w of the n-th well layer 42(n) is increased from 0.14 to 0.16 toward the first direction D1.

As shown in FIGS. 6A and 6B, In composition ratio b of the barrier layer 41 and In composition ratio w of the well layer 42 decrease or increase while accompanied with the minute increase and decrease. In the embodiment, decrease or increase including such minute increase and decrease is also included in the decrease of In composition ratio b of the barrier layer 41 and the increase of In composition ratio w of the well layer 42.

FIGS. 7A and 7B, and 8A and 8B show change of energy bands by the change of In composition ratios of the well layers, respectively.

Figure 7A:
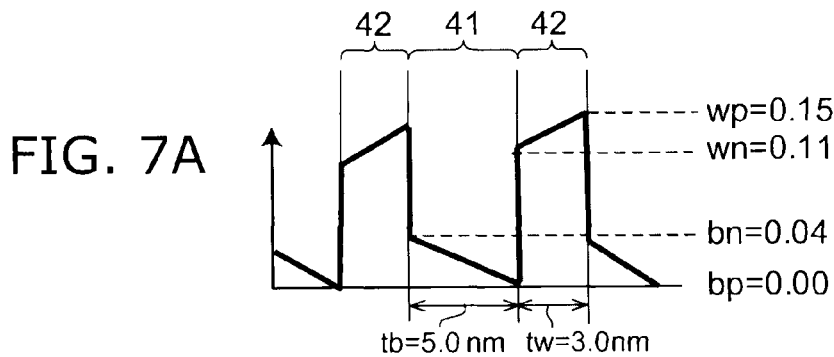
FIG. 7A to FIG. 8B show In composition ratios and energy bands.

In FIG. 7A, the profile of In composition ratios of a case in which wn=0.11, wp=0.15, i.e., Δw=0.04, and bp=0.00, bn=0.04, i.e., Δb=0.04 (where wn and wb are In composition ratios of the well layer 42, and by and bn are In composition ratios of the barrier layer 41), is represented. In addition, the thickness $t_w$ of the well layer 42 is 3 nm, and the thickness $t_b$ of the barrier layer 41 is 5 nm.

Figure 7B:
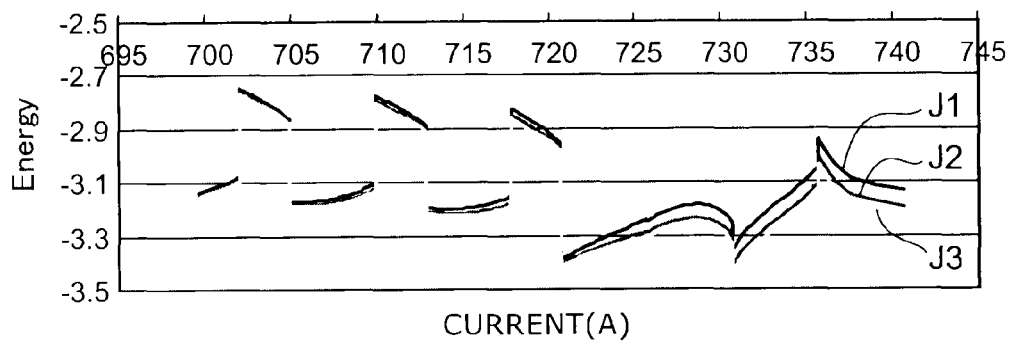

In FIG. 7B, the energy band diagram of a valence band at the In composition ratio profile represented in FIG. 7A is represented. In FIG. 7B, the energy band diagram when current amount flowing to the light emitting layer 40 is changed, is represented. Current amount J1 is 74 A/cm$^2$, current amount J2 is 184 A/cm$^2$, and current amount J3 is 280 A/cm$^2$.

As represented in FIGS. 7A and 7B, change of the energy band diagram by change of the current amounts J1 to J3 is small. In contrast, when the absolute value Δw difference of In composition ratios is 0.04, the energy band diagram of the valence band will not be rectangular.

Figure 8A:
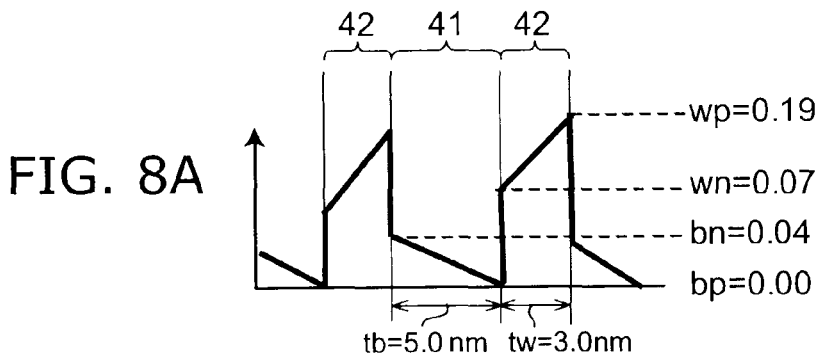

In FIG. 8A, the profile of In composition ratios of a case in which wn=0.07, wp=0.19, i.e., Δw=0.12, and bp=0.00, bn=0.04, i.e., Δb=0.04 (where wn and wb are In composition ratios of the well layer 42, and by and bn are In composition ratios of the barrier layer 41), is represented. In addition, the thickness $t_w$ of the well layer 42 is 3 nm, and the thickness $t_b$ of the barrier layer 41 is 5 nm.

Figure 8B:
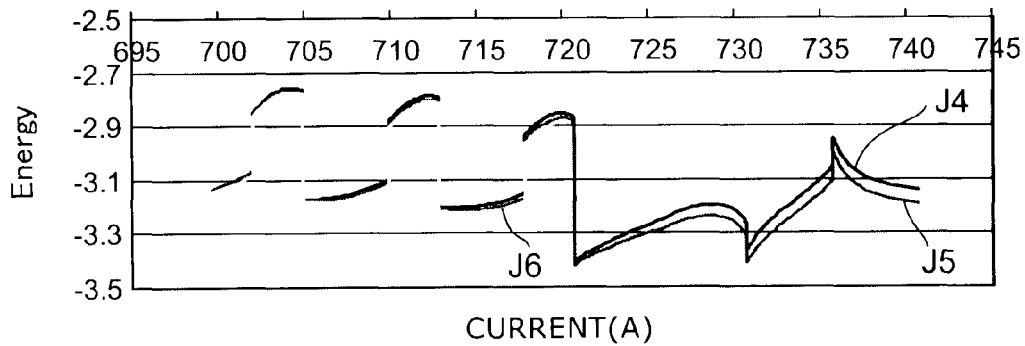

In FIG. 8B, the energy band diagram of a valence band at the In composition ratio profile represented in FIG. 8A is represented. In FIG. 8B, the energy band diagram when current amount flowing to the light emitting layer 40 is changed, is represented. Current amount J4 is 82 A/cm$^2$, current amount J5 is 176 A/cm$^2$, and current amount J6 is 268 A/cm$^2$.

As represented in FIGS. 8A and 8B, change of the energy band diagram by change of the current amounts J4 to J6 is small. In contrast, when the absolute value Δw of the difference of In composition ratios is 0.12, the energy band diagram of the valence band will not be rectangular.

For the semiconductor light emitting device 110 according to the embodiment shown in FIGS. 4A to 4D, the absolute value Δw of the difference in In composition ratio is 0.08. That is, the absolute value Δw of the difference in In composition ratio for the semiconductor light emitting device 110 locates between the absolute value Δw of the difference in In composition ratio shown in FIGS. 7A and 7B and the absolute value Δw of the difference in In composition ratio shown in FIGS. 8A and 8B.

In this case, as shown in FIG. 4C, the energy band diagram of the valence band becomes rectangular.

From the above-mentioned results, it is understood that the absolute value Δw of the difference in In composition ratio of the well layer 42 is desirable to be greater than 0.04 and smaller than 0.12.

FIGS. 9A to 9D are schematic views illustrating the profile of increase and decrease in In composition ratio, respectively.

In the semiconductor light emitting device 110 according to the embodiment, In composition ratio of the barrier layer 41 decreases toward the first direction D1, and In composition ratio of the well layer 42 increases toward the first direction D1.

In FIGS. 9A to 9D, an example of the increase and decrease in In composition ratio is schematically shown, respectively.

Figure 9A:
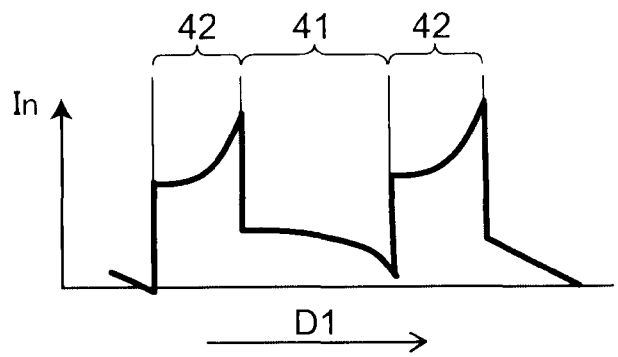
FIGS. 9A to 9D are schematic views illustrating other In composition ratios.

The profile of the increase and decrease in In composition ratio shown in FIG. 9A, is a case in which In composition ratio of the barrier layer 41 decreases in a curved line toward the first direction D1, and In composition ratio of the well layer 42 increases in a curved line toward the first direction D1.

Figure 9B:
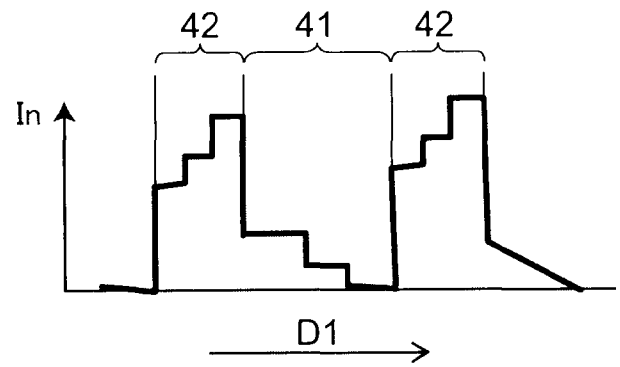

The profile of the increase and decrease in In composition ratio shown in FIG. 9B, is a case in which In composition ratio of the barrier layer 41 decreases in a stepwise fashion toward the first direction D1, and In composition ratio of the well layer 42 increases in a stepwise fashion toward the first direction D1.

Figure 9C:
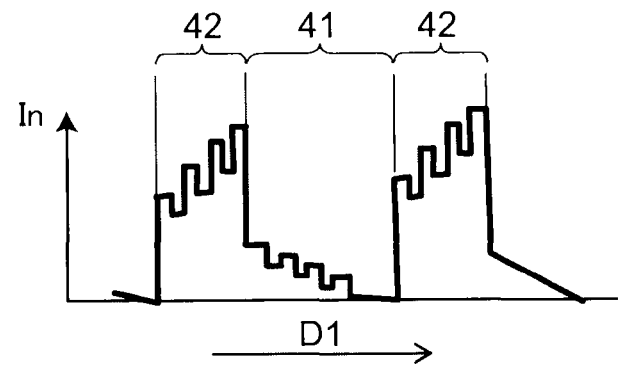

The profile of the increase and decrease in In composition ratio shown in FIG. 9C, is a case in which In composition ratio of the barrier layer 41 decreases toward the first direction D1 while repeating the minute increase and decrease, and In composition ratio of the well layer 42 increases toward the first direction D1 while repeating the minute increase and decrease.

Figure 9D:
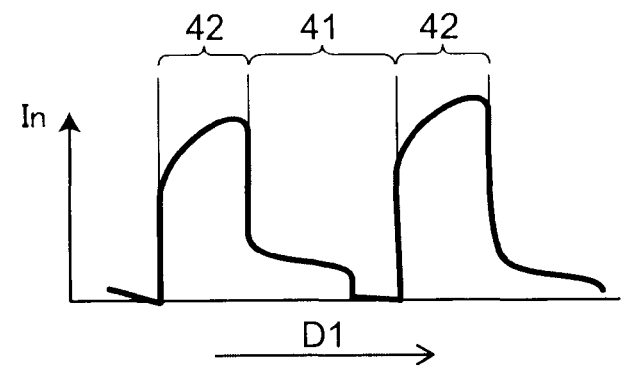

The profile of the increase and decrease in In composition ratio shown in FIG. 9D, is an example in which change in In composition ratio becomes slow at the boundary position between the barrier layer 41 and the well layer 42.

In any of the above-mentioned cases shown in FIGS. 9A to 9D, it is included that In composition ratio of the barrier layer 41 decreases toward the first direction D1, and In composition ratio of the well layer 42 increases toward the first direction D1.

The profile of increase and decrease in In composition ratio may also be one other than the above-mentioned profiles. Also, a profile constituted by suitably combining the profiles of FIGS. 9A to 9D may be used.

FIGS. 10A to 10H are schematic views showing an example of inclination of In composition ratios of the barrier layer and the well layer, respectively.

In each of FIGS. 10A to 10H, the vertical axis represents In concentration ratio and the horizontal axis represents a position. In these drawings, for the sake of clear explanation, one profile for In composition ratio is shown for each of the barrier layer 41 and the well layer 42.

Figure 10A:
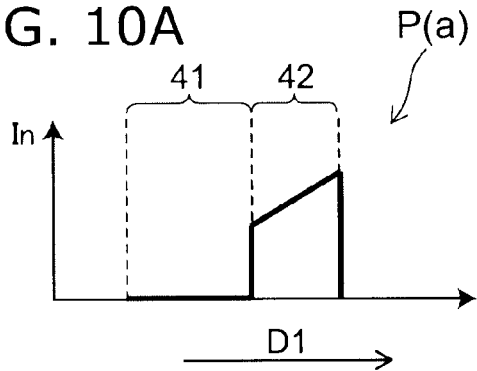
FIGS. 10A to 10H are schematic views showing an example of inclination of In composition ratios.

In the example of inclination of In composition ratio shown in FIG. 10A, In composition ratios of the barrier layer 41 and the well layer 42 increase toward the first direction D1. The profile of In composition ratio shown in FIG. 10A is defined as P(a).

Figure 10E:
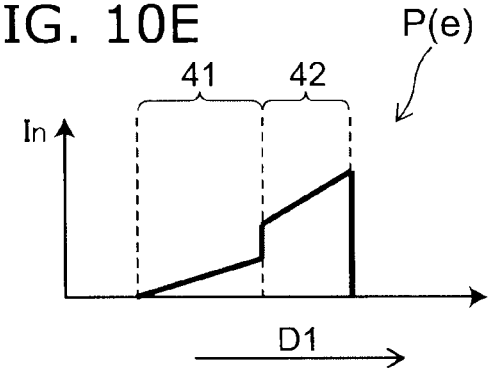
Figure 10B:
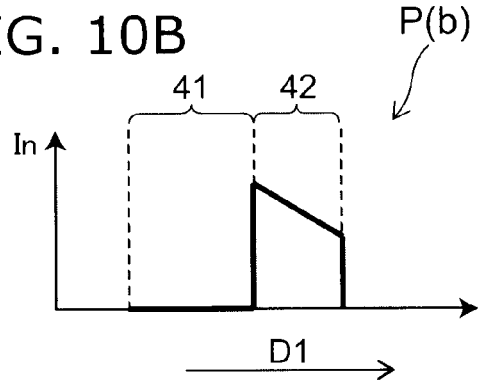

In the example of inclination of In composition ratio shown in FIG. 10B, In composition ratio of the barrier layer 41 is constant, and In composition ratio of the well layer 42 decreases toward the first direction D1. The profile of In composition ratio shown in FIG. 10B is defined as P(b).

Figure 10F:
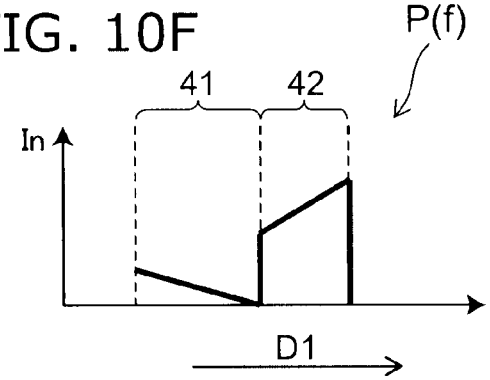
Figure 10C:
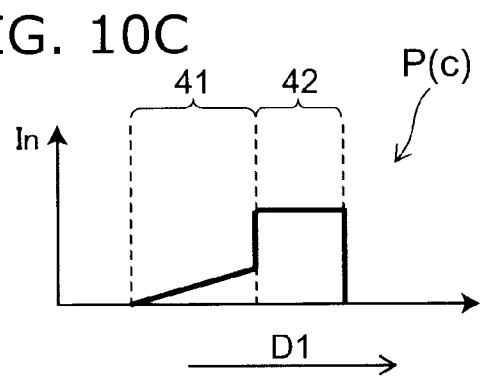

In the example of inclination of In composition ratio shown in FIG. 10C, In composition ratio of the barrier layer 41 increases toward the first direction D1, and In composition ratio of the well layer 42 is constant. The profile of In composition ratio shown in FIG. 10C is defined as P(c).

Figure 10G:
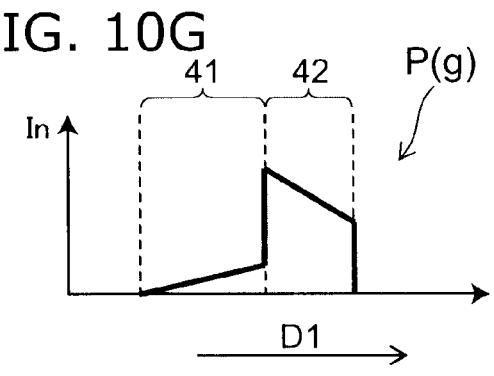
Figure 10D:
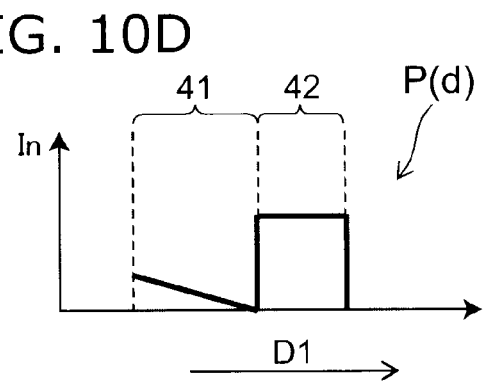

In the example of inclination of In composition ratio shown in FIG. 10D, In composition ratio of the barrier layer 41 decreases toward the first direction D1, and In composition ratio of the well layer 42 is constant. The profile of In composition ratio shown in FIG. 10D is defined as P(d).

In the example of inclination of In composition ratio shown in FIG. 10E, In composition ratio of the barrier layer 41 increases toward the first direction D1, and In composition ratio of the well layer 42 increases toward the first direction D1. The profile of In composition ratio shown in FIG. 10E is defined as P(e).

In the example of inclination of In composition ratio shown in FIG. 10F, In composition ratio of the barrier layer 41 decreases toward the first direction D1, and In composition ratio of the well layer 42 increases toward the first direction D1. The profile of In composition ratio shown in FIG. 10F is defined as P(f).

Profile P (f) is a profile of In composition ratio of the semiconductor light emitting device 110 according to the embodiment.

In the example of inclination of In composition ratio shown in FIG. 10G, In composition ratio of the barrier layer 41 increases toward the first direction D1, and In composition ratio of the well layer 42 decreases toward the first direction D1. The profile of In composition ratio shown in FIG. 10G is defined as P(g).

Figure 10H:
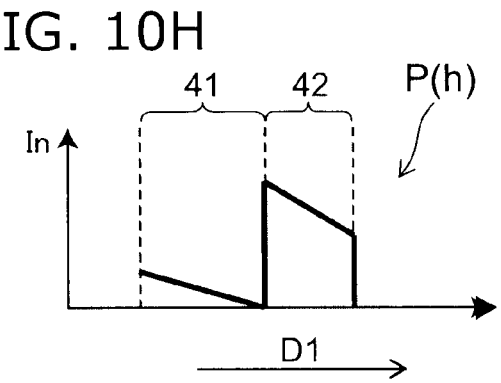

In the example of inclination of In composition ratio shown in FIG. 10H, In composition ratio of the barrier layer 41 decreases toward the first direction D1, and In composition ratio of the well layer 42 decreases toward the first direction D1. The profile of In composition ratio shown in FIG. 10H is defined as P(h).

Figure 11:
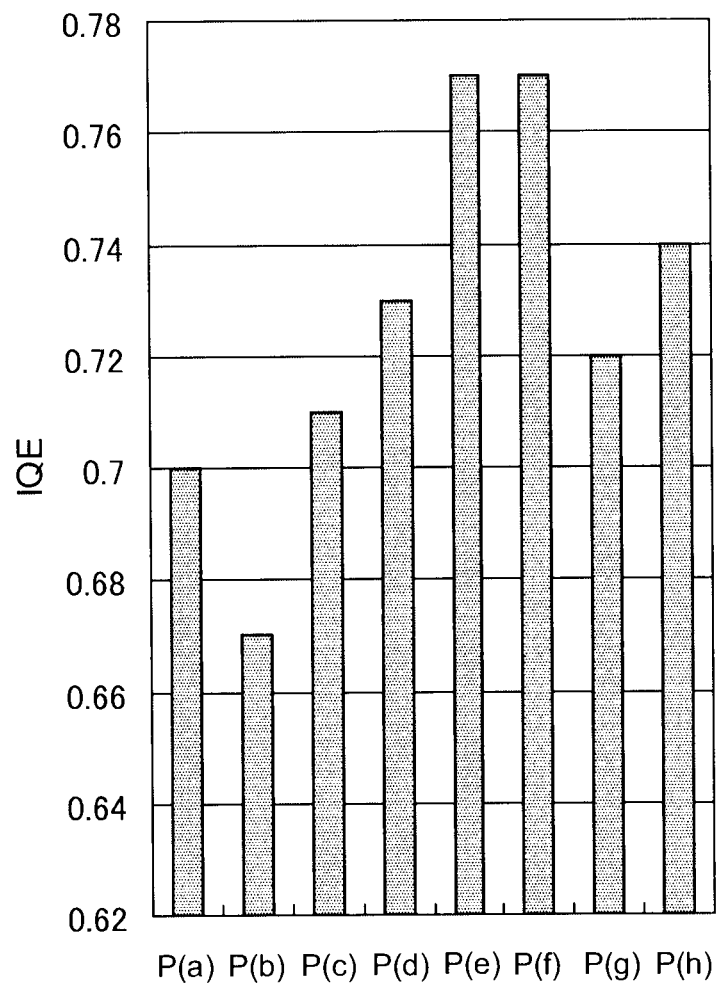
FIG. 11 illustrates internal quantum efficiencies.

FIG. 11 illustrates internal quantum efficiencies.

In FIG. 11, simulation calculation results of internal quantum efficiencies IQE corresponding to In composition ratio profiles P(a) to P(h) shown in FIGS. 10A to 10H, are shown.

In the calculation of internal quantum efficiency, the thickness tw of the barrier layer 41 is set to 5 nm and the thickness tb of the well layer 42 is set to 2.9 nm. Furthermore, In composition ratio of the barrier layer 41 is from 0.00 to 0.04 (the absolute value of the difference Δw=0.04) when In composition ratio of the barrier layer 41 is inclined, and it is assumed that In composition ratio of the well layer 42 is from 0.08 to 0.16 (the absolute value of the difference Δw=0.08) when In composition ratio of the well layer 42 is inclined.

For all cases, 8 barrier layers 41 and 8 well layers 42 are stacked, and all of the 8 barrier layers 41 and 8 well layers 42 are defined to have In composition ratio profiles shown in FIGS. 10A to 10H.

As shown in FIG. 11, profile P(f) of In composition ratio of the semiconductor light emitting device 110 according to the embodiment, leads to a highest internal quantum efficiency among the eight profiles P(a) to P(h).

Here, profile P(e) has also lead to the same internal quantum efficiency as the internal quantum efficiency of profile P (f).n However, like in the profile P(e) shown in FIG. 10E, the in a configuration in which In composition ratio of the barrier layer 41 increases toward the first direction D1, In composition ratio of the barrier layer 41 on the side of the well layer 42 neighboring toward the first direction D1 becomes high. For this reason, the crystallinity of the well layer 42 stacked on this barrier layer 41 tends to be degraded.

Therefore, profile P (f) of In composition ratio of the semiconductor light emitting device 110 according to the embodiment, which is a profile having a good internal quantum efficiency and good crystallinity, is the optimal one.

FIGS. 12A and 12B, and 13A and 13B illustrate relationships between In composition ratio of the barrier layer 41 and the internal quantum efficiency, respectively.

Any of the drawings shows simulation results when only the 8th barrier layer 41 of 8 barrier layers 41, which is nearest to the p-type semiconductor layer 50, is made to have inclined In composition ratio. Further, internal quantum efficiencies IQE are simulation results when current with current amount of current 170 A/cm$^2$ is flown into the light emitting layer 40.

Figure 12A:
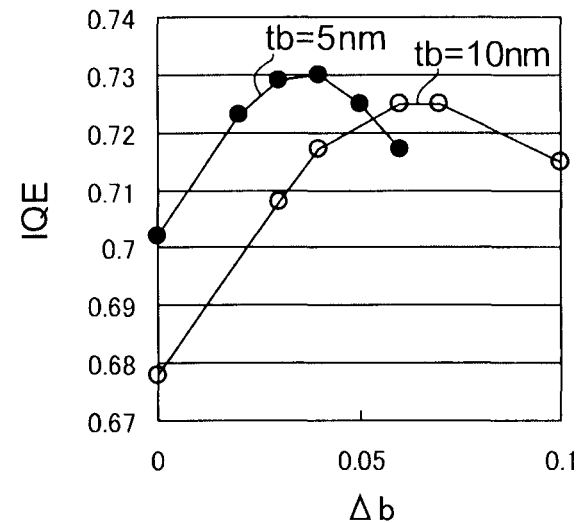
FIG. 12A to FIG. 13B illustrate the internal quantum efficiency.

FIG. 12A shows relationships between the absolute value Δb of the difference in In composition ratio of the barrier layer 41 and the internal quantum efficiency IQE. In FIG. 12A, internal quantum efficiencies IQE when the thickness of the barrier layer 41 is 5 nm and 10 nm, are illustrated.

According to the simulation results shown in FIG. 12A, it is understood that the absolute value Δb of the difference in In composition ratio of the barrier layer 41 has an optimal value. Moreover, it is also understood that the optimal value changes depending on the thickness of the barrier layer 41.

Figure 12B:
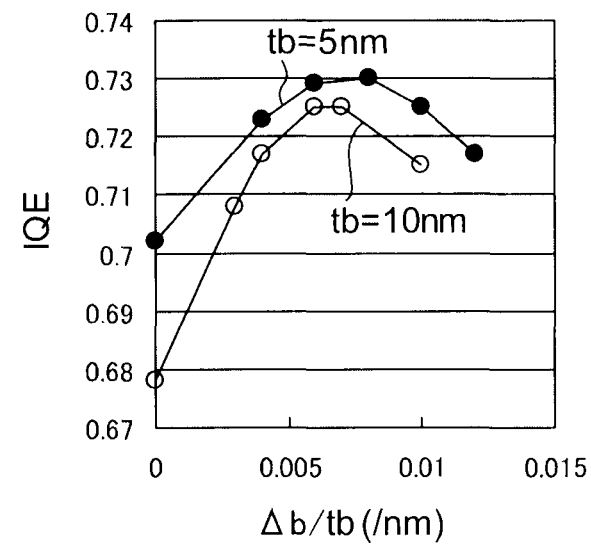

FIG. 12B shows relationships between the difference in In composition ratio per unit thickness (gradient of In composition ratio (Δb/$t_b$)) of the barrier layer 41 and the internal quantum efficiency IQE. In FIG. 12B, internal quantum efficiencies when the thickness of the barrier layer 41 is 5 nm and 10 nm, are illustrated. The gradient of In composition ratio in In composition ratio of the barrier layer 41 is referred to as a value of the absolute value Δb of the difference in In composition ratio divided by the thickness $t_b$.

According to the simulation results shown in FIG. 12B, it is understood that the gradient of In composition ratio (Δb/$t_b$) of the barrier layer 41 has an optimal value irrespective of the thickness of the barrier layer 41.

Figure 13A:
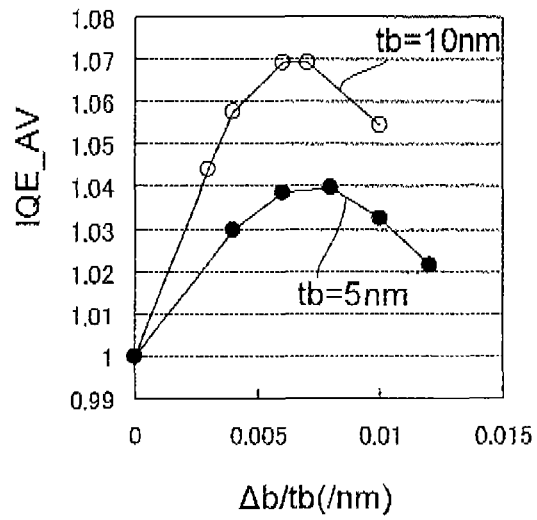

FIG. 13A shows relationships between the gradient of In composition ratio (Δb/$t_b$) of the barrier layer 41 and the rate of rise of the internal quantum efficiency IQE_AV. In FIG. 13A, the rates of rise of the internal quantum efficiency IQE_AV when the thickness of the barrier layer 41 is 5 nm and 10 nm, are illustrated.

According to the simulation results shown in FIG. 13A, it is understood that the rate of rise of the internal quantum efficiency IQE_AV becomes higher as the thickness of the barrier layer 41 increases.

Figure 13B:
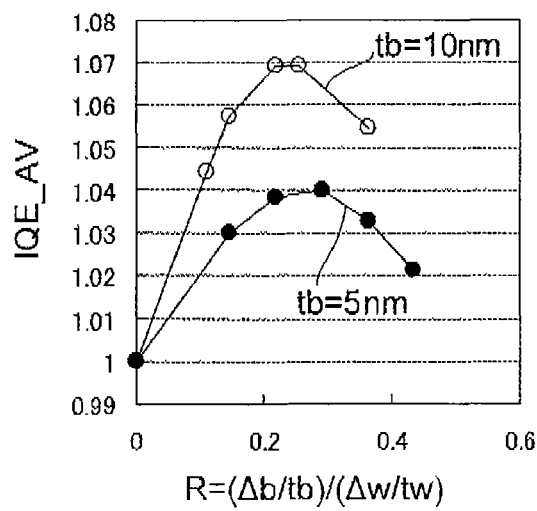

FIG. 13B shows relationships between the ratio R ((Δb/$t_b$)/(Δw/$t_w$)) between the gradient of In composition ratio of the barrier layer 41 (Δb/$t_b$) and the difference per unit thickness in In composition ratio of the well layer 42 (the gradient of In composition ratio (Δw/t_w)) and the rate of rise of the internal quantum efficiency IQE_AV. In FIG. 13B, the rates of rise of the internal quantum efficiency IQE_AV when the thickness of the barrier layer 41 is 5 nm and 10 nm, are illustrated.

According to the simulation results shown in FIG. 13B, it is understood that the rate R has an optimal value. Moreover, it is also understood that the rate of rise of the internal quantum efficiency IQE_AV becomes higher as the thickness of the barrier layer 41 increases.

From the simulation results shown in FIG. 13B, it is preferable to make the ratio R, for example, not less than 0.1 and not more than 0.4, more preferably not less than 0.2 and not more than 0.3.

Although, the embodiment and the example described above, has described In composition in the III group elements of the barrier layer 41 and the well layer 42, they are also applicable to compositions of other than In.

Further, although the embodiment and the example has described a case in which a light emitting layer 40 has MQW structure, the In composition ratio profiles of the barrier layer 41 and the well layer 42 described above are also applicable to a light emitting layer 40 having SQW (Single Quantum Well) structure.

According to the embodiment, a semiconductor light emitting device having a high light emission efficiency is provided.

In the specification, "nitride semiconductor" shall include semiconductors with all composition ratios in chemical formula represented by of $B_\alpha In_\beta Al_\gamma Ga_{1-\alpha-\beta-\gamma}$ ($0 \le \alpha \le 1$, $0 \le \beta \le 1$, $0 \le \gamma \le 1$, and $\alpha+\beta+\gamma=1$), where composition ratios α, β and γ are changed within each range. Furthermore, semiconductors with the chemical formula further including V group elements other than N (nitrogen) and any of various dopants added for controlling conduction type etc. shall also be included in the "nitride semiconductor".

As above, the embodiment of the invention has been described with reference to the specific examples. However, the invention is not limited to these specific examples.

For example, even if specific configurations of elements of the semiconductor light emitting device, such as, an n-type semiconductor, a p-type semiconductor, an active layer, a well layer, a barrier layer, an electrode, a substrate, and a buffer layer are variously modified by a person skilled in the art, the modified configurations shall also be included in the scope of the invention, as long as the person skilled in the art can implement the invention similarly to achieve the similar effect by suitable selection from a known scope.

Further, combination of two or more elements of each of the specific examples within a technically possible scope, shall also be included in the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device, comprising:
    an n-type semiconductor layer containing a nitride semiconductor;
    a p-type semiconductor layer containing a nitride semiconductor; and
    a light emitting layer provided between the n-type semiconductor layer and the p-type semiconductor layer,
    the light emitting layer including a barrier layer containing $In_b Ga_{1-b} N$ ($b \ge 0$), and a well layer stacked with the barrier layer in a direction going from the n-type semiconductor layer toward the p-type semiconductor layer, the well layer containing $In_w Ga_{1-w} N$ ($w > b$),
    an In composition ratio in the barrier layer decreasing in the direction, and
    an In composition ratio in the well layer increasing in the direction, wherein:
        a ratio of a gradient of the In composition ratio of the barrier layer per unit thickness of the barrier layer to a gradient of the In composition ratio of the well layer per unit thickness of the well layer is not less than 0.1 and not more than 0.4,
        the barrier layer has a first end and a second end, the first end is located on a side of the n-type semiconductor layer and has a first value of the In composition ratio, the second end is located on a side of the p-type semiconductor layer and has a second value of the In composition ratio,
        an absolute value of a difference between the first value and the second value is greater than 0.02 and smaller than 0.06,
        the well layer has a third end and a fourth end, the third end is located on a side of the n-type semiconductor layer and has a third value of the In composition ratio, the fourth end is located on a side of the p-type semiconductor layer and has a fourth value of the In composition ratio,
        an absolute value of a difference between the third value and the fourth value is greater than 0.04 and smaller than 0.12,
        a thickness of the barrier layer is not more than 10 nanometers, and
        a thickness of the well layer is not less than 2.5 nanometers and not more than 6 nanometers.

2. The device according to claim 1, wherein a ratio of a first change rate to a second change rate is not less than 0.2 and not more than 0.3, the first change rate is a change in the In composition ratio in the barrier layer with respect to a unit thickness of the barrier layer, and the second change rate is a change in the In composition ratio in the well layer with respect to a unit thickness of the well layer.

3. The device according to claim 1, wherein the second value is 0.00.

4. The device according to claim 1, wherein the absolute value is greater than 0.02 and smaller than 0.04.

5. The device according to claim 4, wherein the second value is 0.00.

6. The device according to claim 1, wherein the absolute value is not less than 0.06.

7. The device according to claim 1, wherein the third value is not more than 0.10.

8. The device according to claim 1, wherein
    the barrier layer is provided in a plurality,
    the well layer is provided in a plurality, and
    the plurality of barrier layers and the plurality of well layers are stacked alternatively.

9. The device according to claim 8, wherein
    in all of the plurality of barrier layers, the In composition ratio in the III group elements decreases in the direction, and
    in all of the plurality of well layers, the In composition ratio in the III group elements increases in the direction.

10. The device according to claim 8, wherein
in a part of the plurality of barrier layers, the In composition ratio in the III group elements decreases in the direction, and
in a part of the plurality of well layers, the In composition ratio in the III group elements increases in the direction.

11. The device according to claim 1, wherein the In composition ratio of the barrier layer and the In composition ratio of the well layer change linearly.

12. The device according to claim 1, wherein the In composition ratio of the barrier layer and the In composition ratio of the well layer change in a stepwise fashion.

13. The device according to claim 1, wherein the In composition ratio of the barrier layer and the In composition ratio of the well layer change in a curved line.

14. The device according to claim 1, wherein the In composition ratio of the barrier layer and the In composition ratio of the well layer change while repeating the minute increase and decrease.

\* \* \* \* \*